United States Patent
Puechberty et al.

[11] Patent Number: 6,026,287
[45] Date of Patent: Feb. 15, 2000

[54] MIXER WITH CROSS-CONNECTED SYMMETRICAL SUBCIRCUIT COUPLINGS

[75] Inventors: Eric Puechberty, Paris; Patrick Jean, Orsay; Christophe Boyavalle, Brunoy, all of France

[73] Assignee: U.S. Philips Corporation, New York, N.Y.

[21] Appl. No.: 08/933,594

[22] Filed: Sep. 19, 1997

Related U.S. Application Data

[63] Continuation of application No. 08/815,235, Mar. 12, 1997.

[30] Foreign Application Priority Data

Mar. 13, 1996 [FR] France ................... 96 03154

[51] Int. Cl.[7] ........................................ H04B 1/28
[52] U.S. Cl. ........................................ 455/333; 327/113
[58] Field of Search ................... 455/333, 323, 455/326; 327/113, 356, 355, 105

[56] References Cited

U.S. PATENT DOCUMENTS

| | | | |
|---|---|---|---|
| 4,947,062 | 8/1990 | Weiner et al. | 327/105 |
| 4,979,233 | 12/1990 | Kawahata | 455/326 |
| 5,060,298 | 10/1991 | Waugh et al. | 455/326 |
| 5,153,469 | 10/1992 | Petted et al. | 327/113 |

*Primary Examiner*—Nguyen Vo
*Assistant Examiner*—Greta J. Fuller
*Attorney, Agent, or Firm*—Steven R. Biren

[57] ABSTRACT

A converter, transmitter and/or receiver for mixing an input signal ($I_{RF}$) having a first frequency (RF) with an input signal ($I_{LO}$) coming from a local oscillator having a second frequency (LO), and for producing an output signal ($O_{IF}$) having an intermediate frequency (IF), with rejection of the harmonics of the second frequency (LO) up to a very high order, for example, higher than the tenth order. The device includes a double balanced ring mixer (17) of field effect transistors (12, 13, 14, 15), having a first and a second pair of input terminals (3, 4; 1, 2) and having a pair of output terminals (5, 6), and a first and a second coupler (18, 19) respectively acting as a phase separator and phase combiner for the input signal ($I_{RF}$) having the first frequency (RF) and output signal ($O_{IF}$) having the intermediate frequency (IF), connected to the first pair of input terminals (3, 4) and to the pair of output terminals (5, 6) respectively, of the ring mixer (17), and each formed by a first and second identical passive phase shifter circuit (300, 400; 500, 600) including isolated elements, and arranged symmetrically so that the respective impedances on the terminals of the first input pair and the terminals of the output pair of the mixer are identical.

13 Claims, 5 Drawing Sheets

MIXER WITH CROSS-CONNECTED SYMMETRICAL SUBCIRCUIT COUPLINGS

This is a continuation of application Ser. No. 08/815,235, filed on Mar. 12, 1997.

BACKGROUND OF THE INVENTION

The invention relates to a device for mixing an input signal having a first frequency RF with an input signal coming from a local oscillator having a second frequency LO, and for producing an output signal having an intermediate frequency IF, with rejection of the harmonics of the second frequency LO up to a very high order, for example, higher than the tenth order, this circuit comprising a ring mixer of double balanced field effect transistors.

The invention finds its application in the integrated circuit industry for the field of telecommunications and, more particularly, in the industry of monolithic microwave integrated circuits (MMICs).

A device including a double balanced and monolithically integrated mixer having a high third order intercept point is already known from the state of the art via U.S. Pat. No. 5,060,298 (referenced Waugh, Oct. 22, 1991).

This document describes a radio frequency mixer which converts a frequency RF of an input signal into an intermediate frequency IF of an output signal by adding together the frequency RF of said input signal and the frequency LO of a signal produced by a local oscillator.

For establishing the mixer itself, four field effect transistors without drain-to-source bias are arranged in rings. The transistors are mounted so that a source of a transistor is connected to the source of the adjacent transistor on one side, and the drain of said transistor is connected to the drain of the adjacent transistor on the other side. The gates of the non-adjacent transistors are coupled to each other.

The mixer also comprises an impedance transformer circuit (BALUN), a frequency combiner circuit (COMBINER) and a phase splitter circuit (PHASE SPLITTER). The impedance transformer circuit comprises at least six distributed stages of field effect transistors and is supplied with the signal coming from the local oscillator to produce two signals having the frequency LO in phase opposition, applied to the coupled gates of the transistors of the ring mixer. It is highly significant to ascertain that this impedance transformer circuit does not have identical impedances on the two anti-phase output terminals directed to ground, respectively (FIG. 3 of said document). The combiner circuit comprises two distributed stages and is connected to the coupled sources of the ring mixer to combine the output signals having the anti-phase intermediate frequency IF. It is highly significant to observe that for combining the signal IF with its complementary signal, this circuit cannot offer the same impedances on its two input terminals, otherwise the combined signal will be zero. The phase splitter circuit comprises a double gate transistor stage and produces on the basis of an input signal having the frequency RF, two anti-phase signals having the frequency RF to be applied to the coupled drains of the ring mixer. Similarly to the other circuits connected to the mixer, this phase-splitter circuit cannot present identical impedances on its output directed relative to ground, otherwise the output signals would be zero.

This known device has for its object to provide an intercept point IP3 of a higher level than 30 dBm. To achieve the selected aim, this mixer circuit is double balanced, i.e. receives anti-phase signals on the two terminals formed by the coupled drains of the transistors and produces anti-phase signals on the two terminals formed by the coupled sources of the transistors; similarly, the gates of the pairs of crosswise coupled transistors receive the signals in phase opposition. The signals having the frequencies RF and LO are situated in a narrow frequency domain between 8.5 and 10.5 GHz for producing a signal having the remote intermediate frequency IF from 0.5 to 2 MHz.

The device known from the cited document is only interested in the third harmonic. Generally, a person of ordinary skill in the art knows that the value of the intercept point IP3 for the greater part depends on the ring mixer and that ever since field effect transistors have been used for establishing the ring mixer, the value of this intercept point is rather high. This value also depends on transforming ratios of the impedance transformers.

A technical problem is posed when the input signal having the frequency RF and the output signal having the intermediate frequency IF are situated in a very narrow frequency domain, instead of the signal having the frequency RF and the signal having the local oscillator frequency as in the cited document. For producing a signal having the intermediate frequency IF which substantially approximates the frequency RF of the input signal, the local oscillator signal is thus to have a frequency LO which is notably lower than that of the signal having the frequency RF so as to obtain the desired frequency mixture.

A person skilled in the art knows that harmonics are always obtained in whatever mixing system. When the signal of the local oscillator has a frequency that is lower and very different from that of the input and output signals i.e. RF and IF which are, on the one hand, higher and, on the other hand, not very different from each other, then the result is that higher-order harmonics, for example, harmonics of the tenth or eleventh order of the local oscillator signal having the frequency LO are situated in the narrow frequency domain of the input and output signals having the respective frequencies RF and IF.

The elimination of the harmonics having the frequency LO of the local oscillator, which run at least up to the tenth order, is thus a different problem from the problem discussed by said document. This problem can only be solved by specific means.

Another problem is posed nowadays due to the demand from the market and the state of the competition, which resides in the fact that only the circuits consuming the least energy are purchased. From this point of view, the device according to the cited document is unfavorable, because it consumes much energy owing to the fact that the circuits connected to the mixers are active circuits which include many transistor stages.

SUMMARY OF THE INVENTION

According to the invention, these problems are solved by a device for mixing an input signal having a first frequency RF with an input signal coming from a local oscillator having a second frequency LO, and for producing an output signal having an intermediate frequency IF, while harmonics of the second frequency LO are rejected up to a very high order, for example, higher than the tenth order, this device comprising:

- a ring mixer of double balanced field effect transistors, having a first and a second pair of input terminals and having a pair of output terminals,
- a first and second coupler respective, being a phase splitter and phase combiner for said input signal which has the first frequency RF and the output signal which has the intermediate frequency IF, connected to the first pair of input terminals and to the pair of output terminals of the ring mixer, respectively, in which device the first and second couplers are formed each by a first and a second identical passive phase shifter sub-circuit respectively, formed by isolated elements and symmetrically mounted so that the respective impedances on the terminals of the first input pair and on the terminals of the output pair of the mixer are identical.

An advantage of this device is that the diametrically opposed terminals of the ring mixer experience exactly identical impedances on a very wide frequency domain from which results that this mixer rejects the harmonics of a very high order, for example, of a order higher than the tenth order, of the signal of the local oscillator when the frequencies of the input and output signals RF and IF respectively, are situated in the narrow frequency domain from about 11 to 14.5 GHz and the frequency of the local oscillator is of the order of 1 to 3 GHz.

Another advantage of this device resides in a very low power consumption of the mixer and of the couplers, which is particularly favorable nowadays because this consumption is, for example, less than 500 mW.

These and other aspects of the invention will be apparent from and elucidated with reference to the embodiments described hereinafter.

DESCRIPTION OF THE PREFERRED EMBODIMENTS

The device will be described hereafter in detail in a preferred embodiment which is not exhaustive.

Figure 1A:
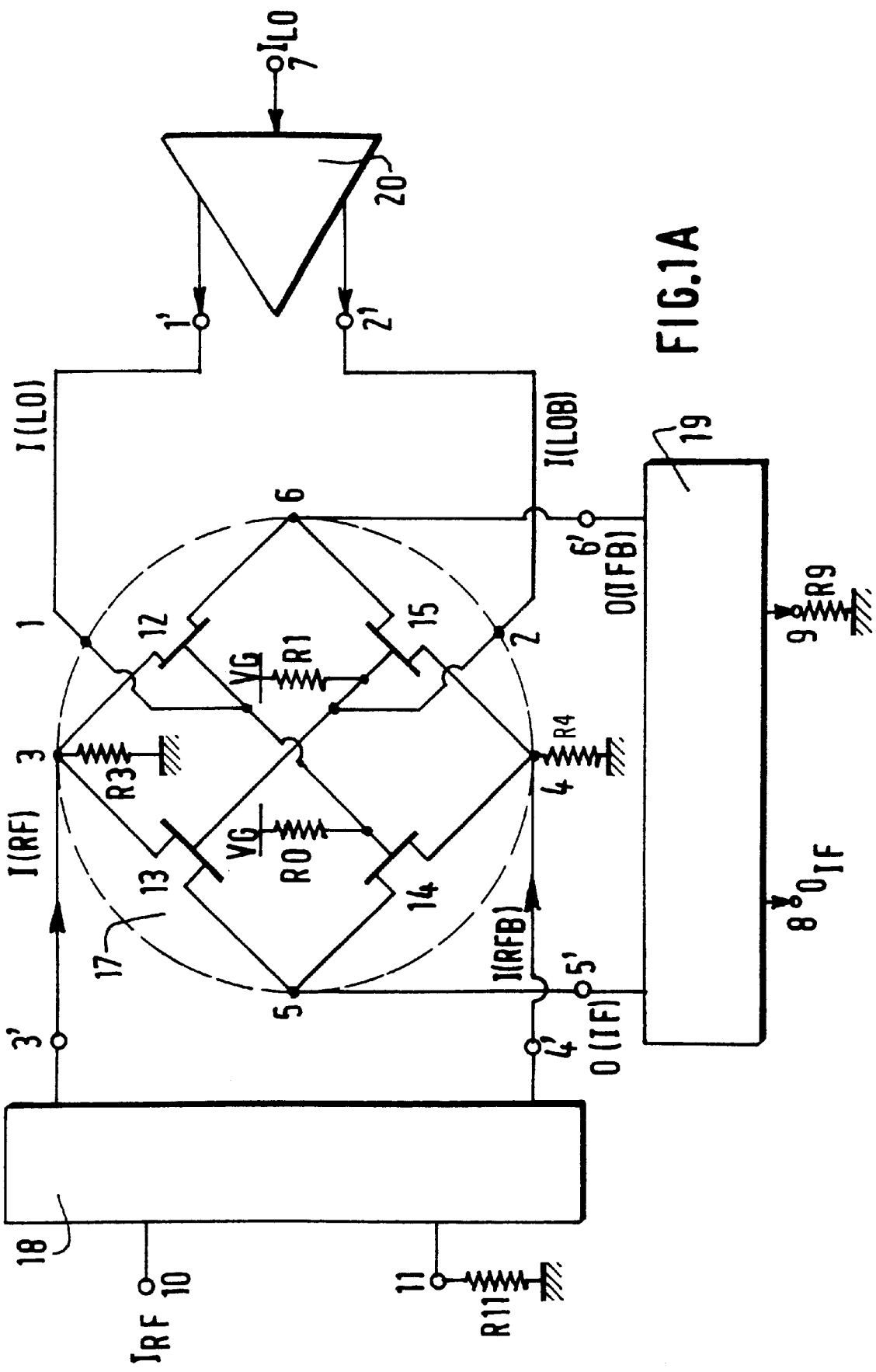
FIG. 1A represents a device comprising a ring mixer of field effect transistors to which mixer are connected a symmetrical coupler and an amplifier for the inputs and a symmetrical coupler for the outputs.

FIG. 1A represents a device for mixing an input signal $I_{RF}$ having a first frequency RF with an input signal $I_{LO}$ having the second frequency LO of a local oscillator (not shown), and for producing an output signal $O_{IF}$ having an intermediate frequency IF, while the harmonics of the frequency LO of the local oscillator up to a high order are rejected. This device comprises:

a double balanced ring mixer 17 of field effect transistors 12, 13, 14, 15, which has a first input pair 3, 4 for a first signal I(RF) having the first frequency RF and its complementary signal I(RFB), which has an output pair 5, 6 for a second signal O(IF) having the intermediate frequency IF and its complementary signal O(IFB), and which has a second input pair 1, 2 for a third signal I(LO) having the frequency LO of the local oscillator and its complementary signal I(LOB), a first coupler 18 which has an input terminal called outside input terminal 10 for the input signal $I_{RF}$ having the first frequency RF, and a pair of output terminals called inside output terminals 3' and 4' for said first signal and its complementary signal I(RF) and I(RFB) which are connected to the terminals of the first pair of inputs 3 and 4 of the ring mixer 17, a second coupler 19 which has two input terminals called inside input terminals 5' and 6' for the second signal O(IF) and its complementary signal O(IFB) connected to the terminals of the pair of outputs 5, 6 of the ring mixer 17, and an output terminal called outside output terminal 8 for said output signal $O_{IF}$ having the intermediate frequency IF, a third coupler 20 which has an input terminal called outside input terminal 7 for the input signal $I_{LO}$ coming from a local oscillator, and a pair of output terminals called inside output terminals 1' and 2' for said third signal I(LO) and its complementary signal I(LOB) which are connected to the terminals of the second pair of inputs 1 and 2 of the ring mixer 17.

The signals on the input and output of the couplers are referenced differently because said couplers may to a certain extent shift the phase of the signals present on the inside terminals relative to the signals present on the outside terminals.

The ring mixer circuit 17 comprises four field effect transistors 12, 13, 14, 15 having each gate, drain and source electrodes arranged in a ring, with:

the drains of the adjacent transistors 12 and 13, on the one hand, and 14 and 15, on the other hand, coupled in pairs for forming the first pair of input terminals, 3, 4, the gates of the non-adjacent transistors 13 and 15, on the one hand, and 12 and 14, on the other hand, coupled crosswise in pairs for forming the second pair of input terminals 1, 2, and the sources of the adjacent transistors 13 and 14, on the one hand, and 15 and 12, on the other hand, coupled in pairs for forming the pair of output terminals 5, 6.

This ring mixer circuit further comprises DC gate-to-drain bias means of the transistors. These bias means comprise:

the application of a bias voltage VG through a resistor RO to the coupled gates of the transistors 12 and 14, the application of a bias voltage VG through a resistor R1 to the coupled gates of the transistors 13 and 15, the connection of the coupled drains 3 of the transistors 12 and 13 to ground through a resistor R3, the connection to ground of the coupled drains 4 of the transistors 14 and 15 through a resistor R4.

The field effect transistors may be of the MESFET type or better still of the MOSFET type.

Figure 1B:
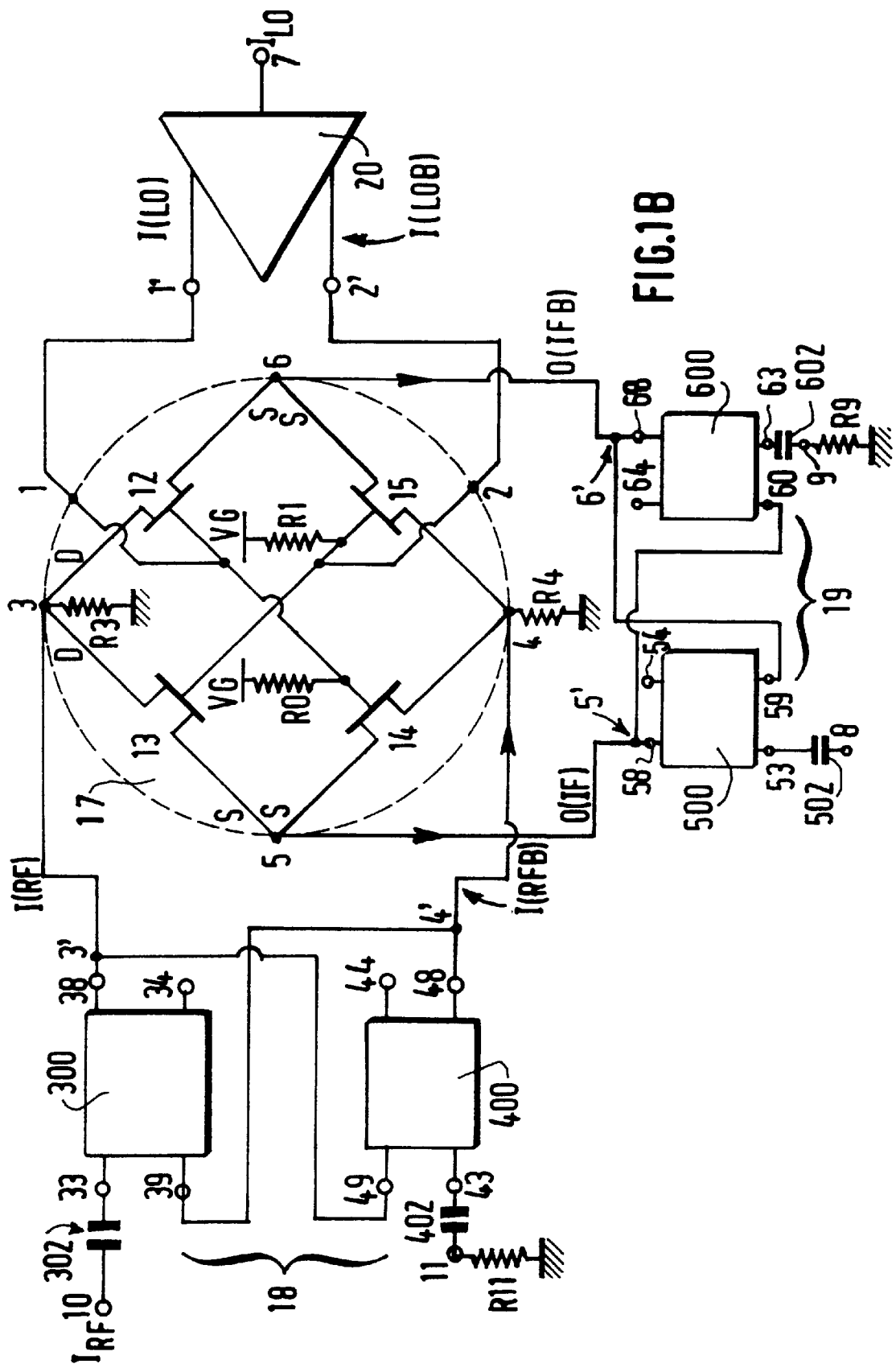
FIG. 1B represents the device of FIG. 1A with the symmetrical arrangement of the couplers.

With reference to FIG. 1B, in this circuit the first and second couplers 18, 19 are formed each by two identical passive phase shifter circuits formed by isolated elements, referenced 300 and 400 respectively, for the first coupler 18 and 500 and 600 for the second coupler 19 and arranged symmetrically, so that, independently for the first and second couplers, the impedances on said first and second inside terminals are identical relative to ground. The result is that the input terminal 3 and the input terminal 4 of the ring mixer 17 experience exactly the same impedance relative to ground, and the output terminal 5 and the output terminal 6 of the ring mixer 17 have exactly the same impedance relative to ground. The first and second couplers 18, 19 are called symmetrical couplers.

In the first symmetrical coupler 18, the first sub-circuit 300 and the second sub-circuit 400 have each a first and a second outside terminal 33, 39 and 43, 49 respectively, and have each a first and a second inside terminal 38, 34 and 48, 44, respectively. The two sub-circuits 300, 400 are arranged symmetrically. To this effect, the first outside terminal 33 of the first sub-circuit 300 is connected to the outside terminal 10 of the corresponding coupler 18 to which is applied the input signal $I_{RF}$ having the first frequency RF, and the first outside terminal 43 of the second sub-circuit 400 is connected to a load R11 which corresponds to the value of the impedance of the generator of said input signal having the first frequency RF. The second outside terminals 39 and 49 respectively, of the first and second sub-circuits are coupled crosswise to the first inside terminals 48 and 38 respectively, of the second and first sub-circuits. These coupling points form the inside terminals 3', 4' of the corresponding coupler 18. The second inside terminals 34 and 44 respectively, of the first and second sub-circuits are floating contacts.

In the second symmetrical coupler 19, the first sub-circuit 500 and the second sub-circuit 600 have each a first and a second outside terminal 53, 59 and 63, 69 respectively, and have each a first and a second inside terminal 58, 54 and 68, 64, respectively. The two sub-circuits 500, 600 are arranged symmetrically. For this purpose, the first outside terminal 53 of the first sub-circuit 500 is connected to the outside terminal 8 of the corresponding coupler 19 where the output signal $O_{IF}$ having the intermediate frequency IF is available, and the first outside terminal 63 of the second sub-circuit 600 is connected to a load R9 which corresponds to the value of the output impedance. The second outside terminals 59 and 69 of the first and second sub-circuits respectively, are coupled crosswise to the first inside terminals 68 and 58 respectively, of the second and first sub-circuits. These coupling points form the inside terminals 5' and 6' of the corresponding coupler 19. The second inside terminals 54 and 64 respectively, of the first and second sub-circuits are floating contacts.

The signal present on the second outside terminal (39, 49) of each sub-circuit of the first coupler 18 is phase shifted through 180° relative to the signal present on the first inside terminal (38, 48), so that the signals present on the inside terminals of the first coupler 18 are phase shifted through 180°.

The first coupler 18 has a phase-splitting function, because it produces two signals I(RF) and I(RFB) which are in phase opposition, based on the input signal $I_{RF}$ having the input frequency RF.

The signal present on the second outside terminal (59, 69) of each sub-circuit of the second coupler 19 is phase shifted through 180° relative to the signal present on the first inside terminal (58, 68), the signals O(IF) and O(IFB) present on the inside terminals 5', 6' of the second coupler 19 which is phase shifted through 180°.

The second coupler 19 thus has a function of combiner because it produces the output signal $O_{IF}$ at the intermediate frequency based on the two anti-phase signals O(IF) and O(IFB).

Figure 2A:
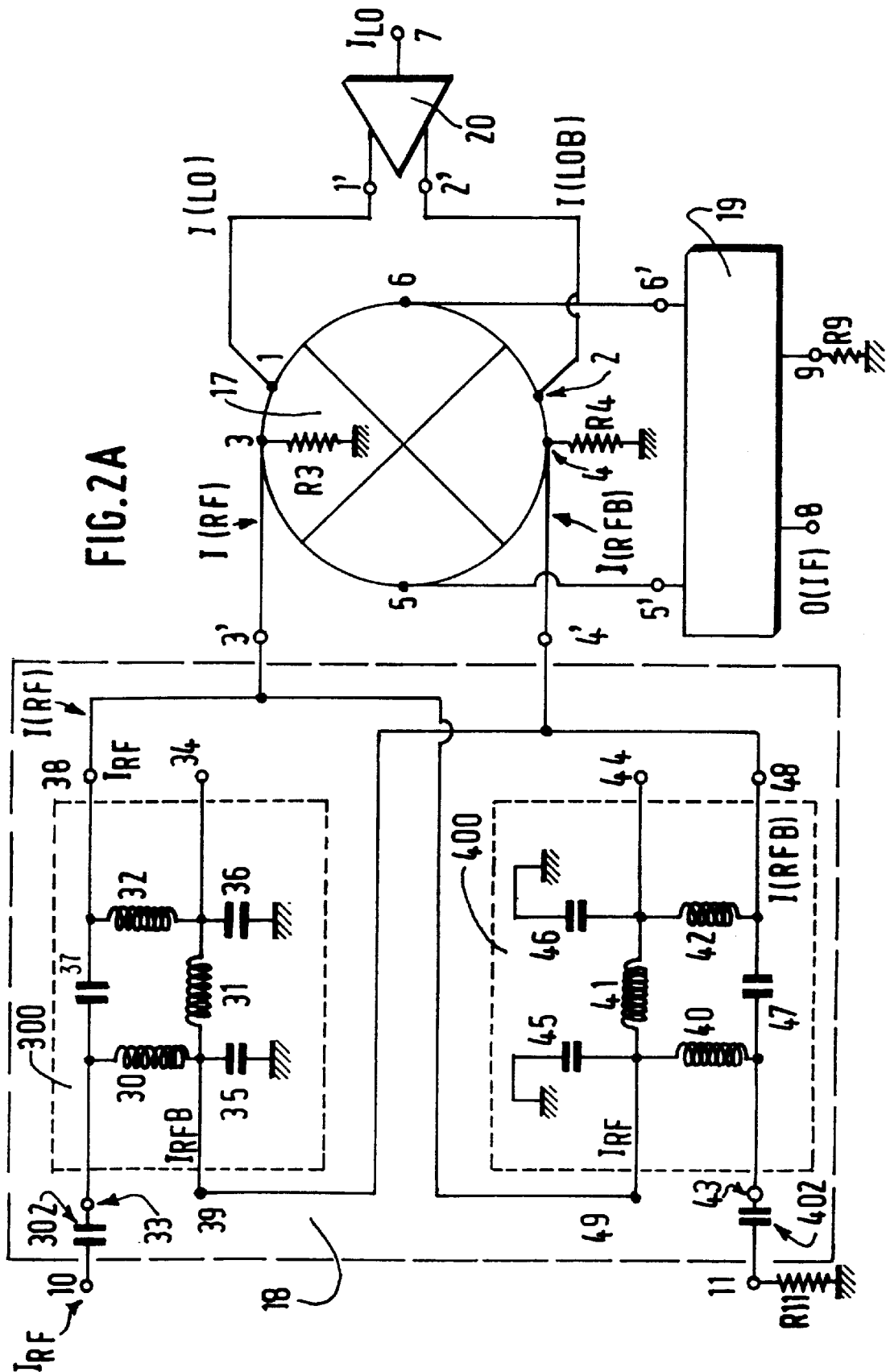
FIG. 2A represents the device of FIG. 1A with, in detail, a symmetrical coupler for the input signal having the frequency RF.
Figure 2B:
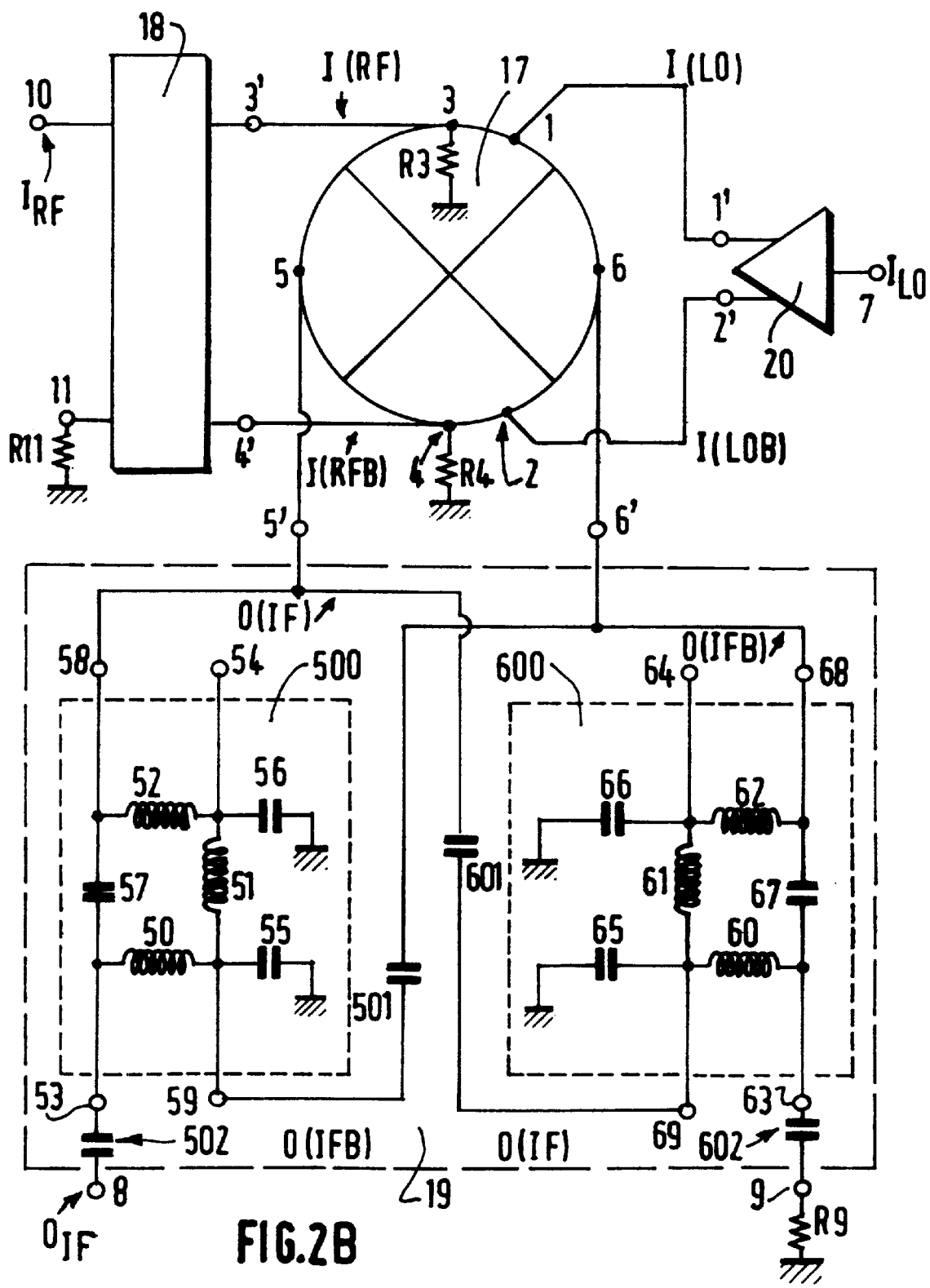
FIG. 2B represents the device of FIG. 1A with, in detail, a symmetrical coupler for the output signal having the intermediate frequency IF.

With reference to FIGS. 2A and 2B, each passive phase shifter circuit 300, 400, 500, 600 is formed by:
- a capacitor 37, 47, 57, 67, inserted between the first outside terminal 33, 43, 53, 63 and the first inside terminal 38, 48, 58, 68,
- an inductor 30, 40, 50, 60 inserted between the first outside terminal and the second outside terminal 39, 49, 59, 69,
- a capacitor 35, 45, 55, 65 between the second outside terminal and ground,
- an inductor 31, 41, 51, 61 between the second outside terminal and the second inside terminal 34, 44, 54, 64,
- an inductor 32, 42, 52, 62 between the second inside terminal and the first inside terminal,
- a capacitor 36, 46, 56, 66 between the second inside terminal and ground.

The values of the isolated elements which form the first and second sub-circuits of the first coupler 18 are exactly identical. The values of the isolated elements which form the first and second sub-circuits of the second coupler 19 are exactly identical.

Figure 3:
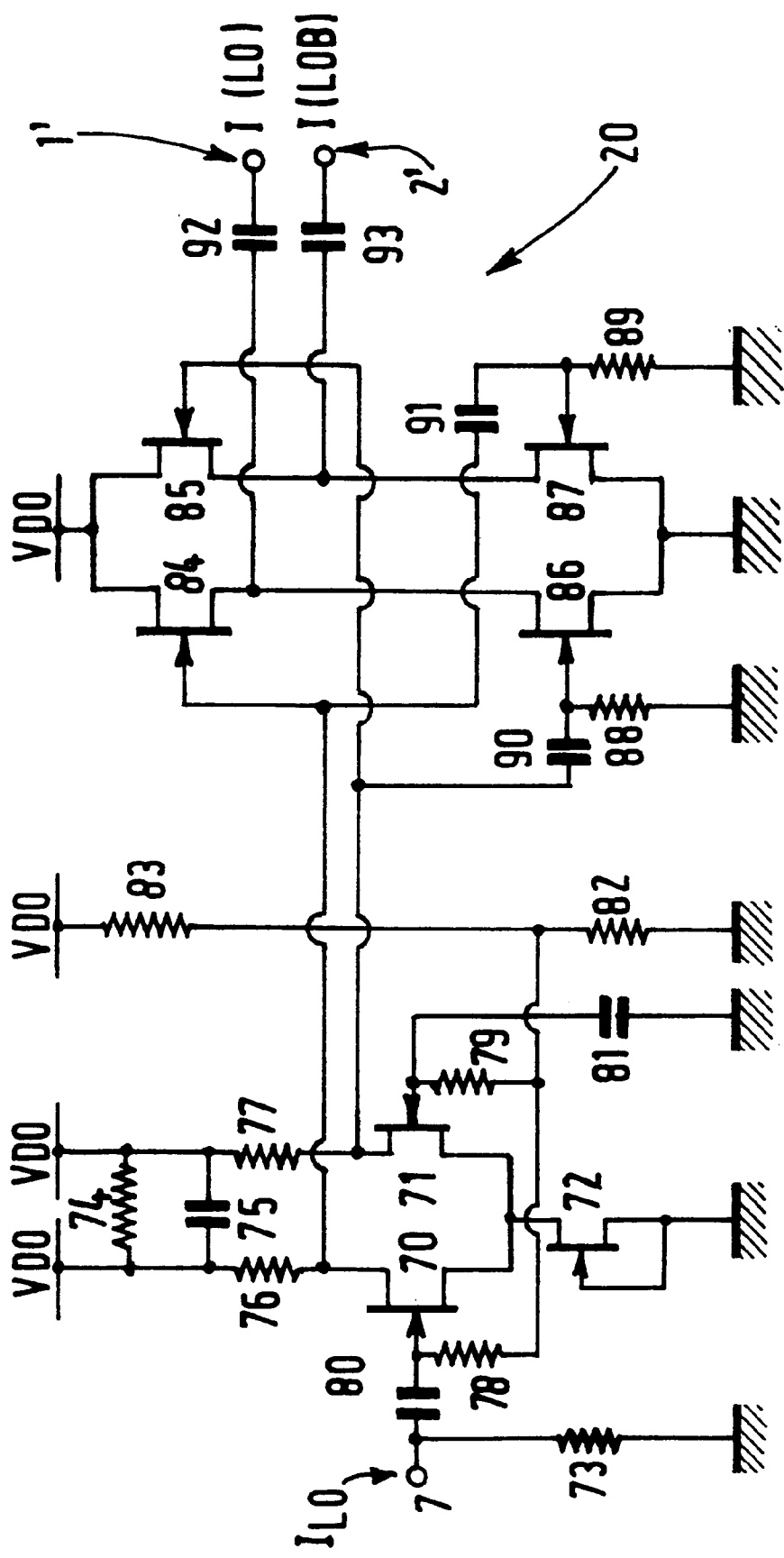
FIG. 3 represents an amplifier for the signal having the frequency LO of the local oscillator.

With reference to FIG. 3, the third coupler 20 advantageously includes a differential amplifier stage and a buffer stage.

The differential amplifier stage comprises two field effect transistors 70 and 71 coupled by their common sources to the drain of a transistor 72 arranged as a current source with its source and gate connected to ground. The drains of the differential transistors are biased with a bias voltage VDD through a resistor 76 and 77, respectively. Via their terminals distributing the bias voltage VDD, the connection points of these resistors 76 and 77 are connected in parallel via a resistor 74 and a capacitor 75. The input signal $I_{LO}$ coming from the local oscillator is applied to the gate of the first and the second differential transistor 70, 71 to an impedance 73 connected to the gate of the first differential transistor 70 and to ground, the gate of the second differential transistor 71 further being connected to ground. The gates of the two differential transistors 70, 71 are biased by an assembly comprising two parallel resistors 78 and 79 of which the coupling point is connected to the bias voltage VDD through a resistor 83, and is connected to ground through a resistor 82.

The buffer stage comprises a first pair of field effect transistors with a lower transistor 86 and an upper transistor 84 connected in series between ground and a terminal for the bias voltage VDD, and a second pair of field effect transistors with a lower transistor 87 and an upper transistor 85 connected in series between ground and a terminal for the bias voltage VDD. The drains of the differential transistors 70, 71 are connected directly to the gates of the upper transistors 84 and 85 of the first and second pair of transistors of the buffer stage respectively, and are connected directly to the gates of the lower transistors 87 and 86 of the second and the first pair of transistors respectively, of this buffer stage. The gates of the lower transistors are further biased relative to ground by means of the resistors 88 and 89.

The third anti-phase signals I(OL) and I(OLB) having the frequency of the local oscillator are available on terminals 1' and 2', on the nodes of the upper and lower transistors. Due to this symmetrical arrangement of the differential buffer stages, the ring mixer 17 finds identical impedances relative to ground on its second input terminals 1 and 2.

By way of example, a device as described above is arranged having the following specifications:
Input frequency RF 13–14.5 GHz
Output frequency IF 10.95–12.75 GHz
Frequency OL 1.25–3.3 GHz
Power consumption <500 mW
In the first coupler (18)
    R11=50 Ω
    The inductors (30, 31, 32)=1 nH each
    The inductors (40, 41, 42)=1 nH each
    The capacitors (37, 47)≅0.1 pF each
    The capacitors (35, 36; 45, 46)≅1 pF each
In the second coupler (19)
    R9=50 Ω
    The inductors (50, 51, 52)=1 nH each The inductors (60, 61, 62)=1 nH each The capacitors (57, 67)≅0.1 pF each The capacitors (55, 56; 65, 66)≅0.1 pF each.

The D.C. isolation capacitor value is about 3 pF.

In the mixer

VG=−1 V

The resistors R3=R4=5 kΩ

The gate width of the MESFET transistors=140 μm each.

In the third coupler VDD=8 V

The gate widths of the transistors of the differential stage=180 μm

The gate widths of the transistors of the buffer stage=70 μm

The resistors (76, 77)=260 Ω each

The resistors (78, 79)=7 kΩ each

The resistors (88, 89)=10 kΩ each.

A device as described above has been integrated with a substrate of the chemical group III-V, advantageously of gallium arsenide (GaAs) for the formation of a semiconductor circuit of the monolithic microwave integrated circuit (MMIC) type.

A device as described above has been utilized in a frequency converter. It may also advantageously be utilized in a transmitting and/or receiving apparatus for telecommunications. This device may be utilized, for example, in satellite transmissions or, for example, in microwave transmissions which are the very high frequency links for telephone, television etc.

We claim:

1. A device for mixing an input signal ($I_{RF}$) having a first frequency (RF) with an input signal ($I_{LO}$) coming from a local oscillator having a second frequency (LO) and for producing an output signal ($O_{IF}$) having an intermediate frequency (IF), with rejection of the harmonics of the second frequency (LO) up to an order higher than the tenth order, said device comprising:

a ring mixer (17) of double balanced field effect transistors (12, 13, 14, 15), the mixer having a first and a second pair of input terminals (3, 4; 1, 2) and having a pair of output terminals (5, 6); and a first and a second coupler (18, 19) respectively comprising a phase splitter and a phase combiner for said input signal ($I_{RF}$) which has the first frequency (RF) and the output signal ($O_{IF}$) which has the intermediate frequency (IF), connected to the first pair of input terminals (3, 4) and to the pair of output terminals (5, 6) of the ring mixer (17), respectively;

wherein the first and second couplers (18, 19) each comprise a first and a second identical passive phase-shifter sub-circuit (300, 400; 500, 600) respectively, formed by isolated elements and symmetrically mounted so that the respective impedances on the terminals of the first input pair and on the terminals of the output pair of the mixer are identical.

2. A device as claimed in claim 1, in which:

the first and the second coupler (18, 19) each have an outside terminal (10, 8) for said input signal ($I_{RF}$) having the first frequency (RF) and the output signal ($O_{IF}$) having the intermediate frequency (IF), and a pair of inside terminals (3', 4'; 5', 6') for the respective first anti-phase signals having the frequency of said input signal (I(RF), I(RFB)), and second anti-phase signals (O(IF), O(IFB)) having the frequency of the output signal, and are connected to the first pair of input terminals (3, 4) and to the pair of output terminals (5, 6) of the ring mixer (17), respectively;

and in which device, in the first and the second coupler (18, 19) the first and second sub-circuits each have a first and a second outside terminal and a first and a second inside terminal and are arranged symmetrically with the first outside terminal (33, 53) of the first sub-circuit (300, 500) connected to the outside terminal (10, 8) of the corresponding coupler (18, 19), and the first outside terminal (43, 63) of the second sub-circuit (400, 600) connected to a load (R11, R9), and the second outside terminal (39, 49; 59, 69) of each sub-circuit coupled crosswise with the first inside terminal (38, 48; 58, 68) of the symmetrical sub-circuit, said coupled terminals being connected respectively to the first and second inside terminals (3', 4'; 5', 6') of the corresponding coupler (18, 19).

3. A device as claimed in claim 2, in which each passive phase shifter sub-circuit is formed by:

a capacitor (37, 47; 57, 67) coupled between the first outside terminal (33, 43; 53, 63) and the first inside terminal (38, 48; 58, 68), an inductor (30, 40; 50, 60) coupled between said first outside terminal and the second outside terminal (39, 49; 59, 69), a capacitor (35, 45; 55, 65) coupled between said second outside terminal and ground, an inductor (31, 41; 51, 61) coupled between the second outside terminal and the second inside terminal (34, 44; 54, 64), and an inductor (32, 42; 52, 62) coupled between said second and said first inside terminals, with a capacitor (36, 46; 56, 66) coupled between said second inside terminal and ground.

4. A device as claimed in claim 3, in which the ring mixer circuit (17) comprises four field effect transistors (12, 13, 14, 15) each having gate, drain and source electrodes arranged as a ring with the drains of the adjacent transistors coupled for forming the first pair of input terminals (3, 4), the sources of the adjacent transistors coupled for forming the pair of output terminals (5, 6), and the gates of the non-adjacent transistors coupled in pairs crosswise for forming the second pair of input terminals (1, 2), the ring mixer circuit further comprising gate-to-drain DC bias means (VG, R3; VG, R4) of the transistors.

5. A device as claimed in claim 4, comprising a third coupler (20) which has an outside terminal (7) for said input signal ($I_{LO}$) having the frequency of the local oscillator, and a pair of inside terminals (1', 2') for a third signal and its complementary signal ((ILO), I(LOB)) having the frequency of said local oscillator signal, connected to the second pair of input terminals (1, 2) of the ring mixer (17), in which the impedances on said first and second inside terminals are identical relative to ground.

6. A device as claimed in claim 5, in which the third coupler comprises a field effect differential amplifier stage which receives on the outside terminal (7) the input signal ($I_{LO}$) having the frequency (LO) of the local oscillator, and a symmetrical field effect transistor buffer stage connecting to the inside terminals (1', 2') with symmetrical identical impedances relative to ground.

7. A device as claimed in claim 1, in which the field effect transistors of the mixer (17) are of the MESFET type.

8. A device as claimed in claim 1, in which the field effect transistors of the mixer (17) are of the MOSFET type.

9. A device as claimed in claim 1, which is monolithically integrated with a semiconductor or semi-insulating substrate of a material of the group III-IV for operation at microwave frequency (MMIC).

10. A device as claimed in claim 9, for operation with an input signal ($I_{RF}$) and an output signal ($O_{IF}$) having neighbouring frequencies which are approximately five to fifteen times the value of the frequency of the signal ($I_{LO}$) of the local oscillator.

11. A frequency converter apparatus including a device as claimed in claim 1.

12. A transmitting and/or receiving apparatus including a device as claimed in claim 1.

13. An apparatus as claimed in claim 12, for microwave transmission.

* * * * *